(12) United States Patent
Kawase

(10) Patent No.: US 7,560,133 B2
(45) Date of Patent: Jul. 14, 2009

(54) PATTERNING METHOD

(75) Inventor: Takeo Kawase, Suwa (JP)

(73) Assignees: Seiko Epson Corporation, Tokyo (JP); Cambridge University Technical Services Limited, Cambridge (GB)

(*) Notice: Subject to any disclaimer, the term of this patent is extended or adjusted under 35 U.S.C. 154(b) by 612 days.

(21) Appl. No.: 10/296,181

(22) PCT Filed: Mar. 28, 2002

(86) PCT No.: PCT/GB02/01483

§ 371 (c)(1),
(2), (4) Date: Feb. 20, 2003

(87) PCT Pub. No.: WO02/082561

PCT Pub. Date: Oct. 17, 2002

(65) Prior Publication Data

US 2003/0157244 A1 Aug. 21, 2003

(51) Int. Cl.
B05D 5/12 (2006.01)

(52) U.S. Cl. ............... 427/77; 427/64; 427/271

(58) Field of Classification Search ........... 427/58, 427/64–69, 270–271, 336–337
See application file for complete search history.

(56) References Cited

U.S. PATENT DOCUMENTS

| | | | |
|---|---|---|---|
| 4,735,890 A | 4/1988 | Nakane | |
| 5,242,711 A | 9/1993 | DeNatale et al. | |
| 5,647,999 A | 7/1997 | Tada et al. | |
| 6,623,097 B2 * | 9/2003 | Okada et al. | 347/21 |
| 6,641,859 B1 * | 11/2003 | Long et al. | 427/66 |
| 7,090,890 B1 * | 8/2006 | Sturm et al. | 427/68 |

FOREIGN PATENT DOCUMENTS

| | | |
|---|---|---|
| EP | 1 030 383 A2 | 8/2000 |
| GB | 2 330 451 A1 | 4/1999 |
| JP | A 3-25937 | 2/1991 |
| JP | A 2001-6541 | 1/2001 |
| WO | WO 01 47044 A2 | 6/2001 |

OTHER PUBLICATIONS

Madigan et al., "Lateral dye distribution with ink jet dye doping of polymer organic light emitting diodes".*
Madigan et al., "Lateral dye distribution with ink jet dye doping of polymer organic light emitting diodes" Apr. 2000 (no month).*
Yang et al., "Organic polymeric electroluminescent devices processed by hybrid ink-jet printing" Journal of Materials Science Materials in Electronics Chapman and Hall, London, GB. vol. 11. No. 2. Mar. 2000, pp. 89-96. XP001032490.

(Continued)

Primary Examiner—Brian K Talbot
(74) Attorney, Agent, or Firm—Oliff & Berridge, PLC

(57) ABSTRACT

A patterning method comprises selectively depositing droplets of a first material solvent solution onto a layer of a second material. The solvent is chosen to dissolve both materials, which are selected so as to exhibit phase separation upon the removal of the solution to provide domains of the first material embedded in and extending through the second material. By selection of appropriate materials the patterning method may be used, for example, to fabricate light emitting devices, optical color filters, or vertical interconnects in electronic devices.

17 Claims, 11 Drawing Sheets

OTHER PUBLICATIONS

Madigan et al., "Lateral Dye Distribution with Ink-Jet Dye Doping of Polymer Organic Light Emitting Diodes", Materials Research Society Symposium Proceedings. Materials Research Society. Pittsburgh. PA. US, vol. 624, Apr. 2000, pp. 211-216, XP001040005.

* cited by examiner

Shrink type

Mesa type

Ring type

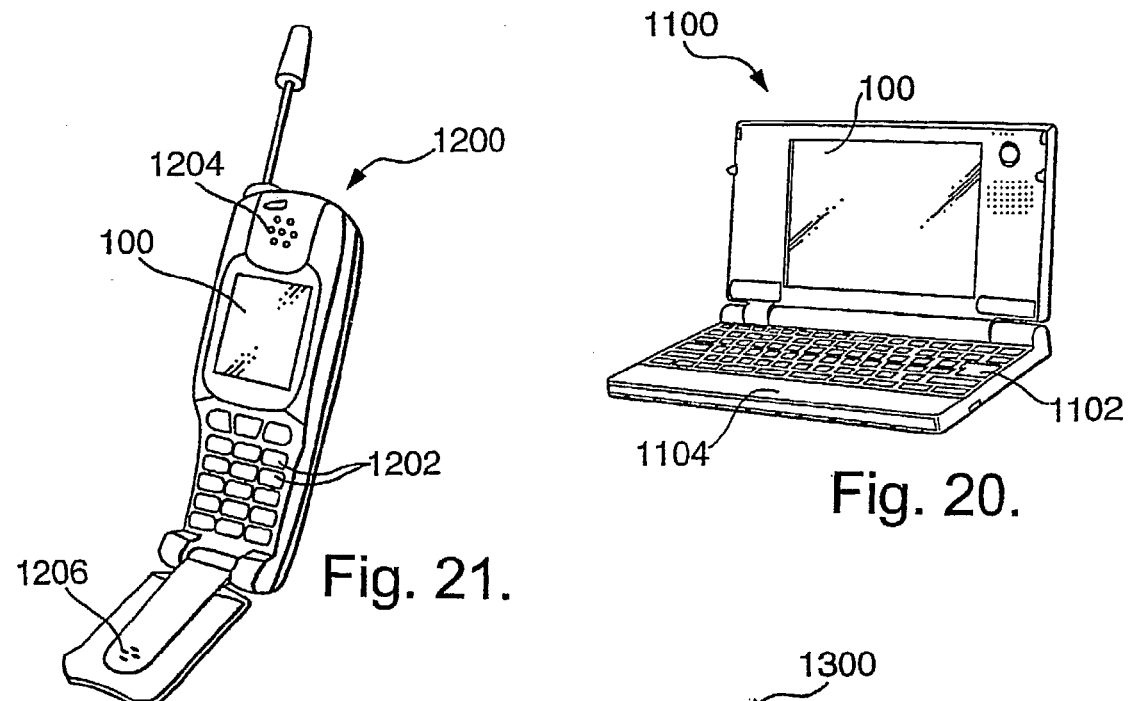
Fig. 20.
Fig. 21.
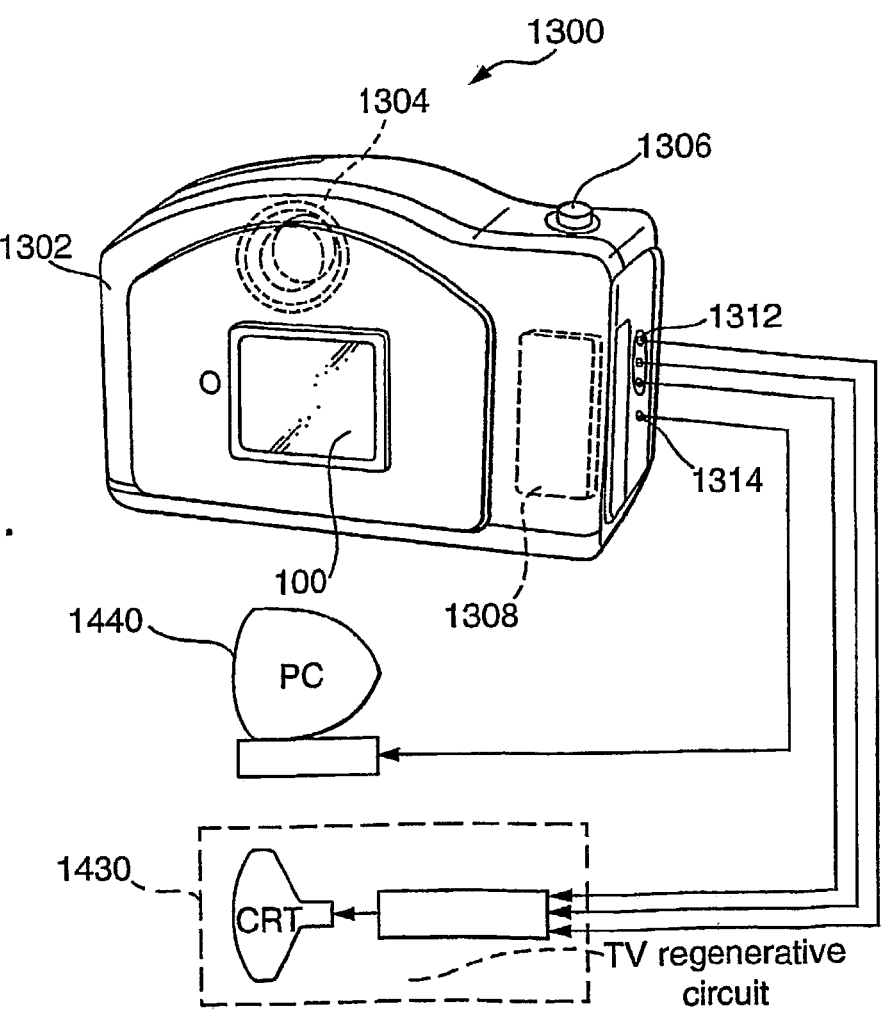
Fig. 22.

PATTERNING METHOD

BACKGROUND

The present invention relates to a patterning method and in particular to a patterning method for fabricating electronic or optical devices, such as light emissive devices, integrated circuits and optical filters, incorporating organic polymer materials.

The present invention also relates to electrical and optical devices fabricated by the patterning method.

In recent years, display devices incorporating electroluminescent organic polymer light emissive materials have been proposed and these are frequently referred to as electroluminsecent (EL) displays.

In such displays, a soluble electroluminescent polymer is deposited onto a solid substrate such as, for example, a glass, plastics or silicon substrate.

Spin-coating is the typical deposition method for the polymer EL display. This does not need vacuum processes to deposit organic layers, so it may be considered as an inexpensive process. As such only one type of polymer material may be deposited for a device, which limits the use of the materials to a monochrome display. Multicolour displays cannot in practice be achieved without severe fabrication difficulties using a spin coating technique because the various areas of the display would be required to be masked during the spin coat deposition for each required colour. Furthermore the spin-coated polymer layer covers all areas of a substrate involving even areas which are not required to be coated. A plasma etching or laser ablation process is required in order to remove the polymer layer from such areas on the substrate, increasing fabrication costs.

Ink jet printing techniques have been proposed to deposit soluble polymers because of the ability to use inkjet technology for the processing of multi-colour devices and also because of the relatively low cost of using such techniques. It is possible to deposit polymers only on necessary parts, therefore, the removal process is not needed.

It has been realized with the present invention that inkjet technology is also ideally suited to the deposition of the above soluble organic polymer materials to provide not only light emissive displays, but also other types of devices incorporating the organic polymer materials. However, to facilitate the deposition of such soluble materials it is usual for the receiving substrate to be provided with a pattern of wall structures defined in a de-wetting material so as to provide an array of wells or trenches, bounded by the wall structures, to receive the soluble polymer materials being deposited. These wall structures are known within this art as bank structures and this term will be used in this disclosure when referring to such structures.

FIG. 1 shows a cross-section of a part of a light emissive display device. A substrate 2 supports a conductive electrode 4 such as a layer of indium tin oxide (ITO), which acts as the anode electrode for the display device. A bank structure (separator) 6 is provided on the electrode 4 and a light emissive polymer material 8 is deposited into wells defined by the bank structure and into contact with the electrode 4 by using an inkjet technique. The bank structure has a repelling (dewetting) surface, resulting in the deposited material being confined by the walls defined in the bank structure 6. A second electrode 10, which acts as a cathode electrode for the device, is then deposited over the bank structure and into contact with the light emissive polymer material. When a voltage is applied between the anode and cathode electrodes 4, 10, a current flows through the material 8 which, in response, emits light to display an image of a predefined shape or pattern.

As mentioned above, the function of the bank structure is to define the position of the light emitter correctly even when there is some fluctuation in the position of the inkjet deposition. This function is important especially when a number of soluble organic polymers are deposited as an array of dots which are addressed via active or passive matrix addressing schemes because accurate positioning of the dots is necessary for such a array. With displays of the above type any image may be displayed by applying appropriate addressing signals to the electrodes of the matrix addressing scheme, whereby pixels constituted by the dots of organic polymer material are driven to emit light and provide the pixel images of the display. Such displays are able to display either static or moving images.

However, there is also a significant requirement for what are frequently referred to as static displays in which it is required to display a fixed or static image which is defined by physical features of the display. Such static displays may take many forms and can be used for providing information of many kinds to a viewer, such as warning signs, advertising slogans or messages, or information such as displayed on motor vehicle or aircraft panel displays or the like. These static displays may also be provided in combination with the above referred to addressed pixel type displays. In the case of a static display, the bank structure 6 serves an important additional function as it is required also to act as an insulator layer so that a short circuit does not occur between the anode and cathode electrodes. The bank structure may comprise any suitable insulator material, such as polyimide, and may be deposited by any suitable process, such as spin coating. However, the bank material, in its deposited condition, comprises a continuous layer and hence forms an insulating barrier to the underlying anode electrode 4. Wells 12 must therefore be defined in and extending through the bank material, to provide the bank structure shown in FIG. 1, thereby enabling the light emissive polymer material to be deposited into contact with the anode electrode which underlies the bank material.

The bank structure is usually defined in the bank material using a photolithographic technique but this is a relatively expensive process, involving an exposure step with photolithographic masks, a developing step, an etching step, stripping and cleaning steps. The static display is a relatively low-price product and the bank structure is not therefore ideal for such a display in terms of a production cost. Furthermore, if the light emissive polymers were to be deposited with an inkjet head in the wells which are defined by the bank structure, the position of the inkjet head needs to be aligned accurately with the position of the wells, resulting in a low throughput and an increase in the fabrication. If there are failures in the alignment, a well in the bank structure may not receive a droplet from the ink jet head, leaving the underlying anode electrode exposed. The subsequently deposited cathode electrode can therefore contact directly the exposed area of anode electrode and the devices do not function correctly due to leakage currents or short circuits between the electrodes.

A static display device fabricated in accordance with the above technique may typically be as shown in FIG. 2, where it can be seen that the anode electrode 4 may comprise conductive patches of ITO, and the bank structure is defined so as to provide letter or symbol patterns of the conductive light emissive polymer 8. The patterns can be changed flexibly because the bank structure is patterned by photolithography. Inkjet printing is, by virtue of its origin, a very flexible printing method, and one can easily change patterns by computer control. However, the bank structure negates such flexibility in inkjet printing techniques.

SUMMARY

It is an object of the present invention to provide an improved patterning method which may, for example, be used for the fabrication of a static display, light emissive or light transmissive devices and, in particular, to provide a method which does not require the use of a photolithographic technique.

According to a first aspect of the present invention, there is provided a patterning method comprising depositing a layer of a first material, selectively depositing onto a first surface of the first material in the form of a droplet a solution of a second material in a solvent, the solvent being selected so as to be capable of also dissolving the first material, the first and second materials being selected such that phase separation occurs between the first and second materials upon removal of the solvent so as to provide at least one domain comprising the second material embedded in and extending through to a second surface of the layer of the first material, the second surface being opposite to the first surface.

In a preferred form of the invention, the first and/or second materials comprise polymer materials.

Preferably, one of the polymer materials is selected to have a coil-like chain structure and the other of the polymer materials is selected to have a rod-like chain structure at least in a part of its chain.

Advantageously, the first polymer material is deposited onto a first electrode, one of the polymer materials comprises an electrically insulating polymer and the other of the polymer materials comprises a light emissive polymer material, and providing a second electrode in electrical contact with the light emissive polymer material.

Most advantageously, the first polymer material comprises the insulating polymer material.

The method may comprise selectively depositing as a droplet a solution of a further light emissive polymer material in a solvent selected to be capable of dissolving the first polymer material so as to provide at least one domain of the further light emissive polymer material in electrical contact with the first and second electrodes.

The further polymer material is preferably selected such that it can emit light of a first colour and the said other light emissive polymer material is selected such that it can emit light of a second colour different to the first colour.

In a preferred arrangement, the first electrode comprises first and further electrode patterns electrically isolated from one another. The first and further electrode patterns may comprise interdigitated electrode patterns. Preferably, the further light emissive polymer material is selectively deposited so as to contact one of the first and further electrode patterns and the said other light emissive polymer is selectively deposited to contact another of the first and further electrode patterns.

Preferably, the further light emissive polymer material and the said other light emissive polymer material is each arranged to comprise an array of domains of at least red, green and blue light emissive polymer materials for enabling a first multi-colour image to be displayed by applying a voltage between one of the interdigitated electrode patterns and the second electrode and a further multi-colour image to be displayed by applying a voltage between another of the interdigitated electrode patterns and the second electrode.

The thickness of the polymer material in one domain may be arranged to differ from the thickness of the polymer material in another of the domains. The domains may be essentially circular in shape and the area of one domain may differ from the area of another of the domains. Furthermore, the distribution density of the polymer material in one domain may differ from the distribution density of the polymer material in another of the domains so as to provide domains capable of exhibiting grayscale.

In another aspect of the present invention, the first polymer material is selected to be substantially opaque to visible light and the second polymer material is selected to be capable of transmitting light of a first colour.

In a further aspect of the present invention, the first polymer material comprises an insulator polymer material and the second polymer material is arranged to comprise a conductive polymer material and to extend through the layer of the insulator polymer material, the method further comprising providing an electrode pattern in electrical contact with the conductive polymer material thereby to provide a conductive interconnect between the electrode pattern and a layer underlying the insulator polymer material.

Advantageously, the solvent is selected to comprise an aromatic and/or chlorinated hydrocarbon solvent.

Most advantageously, the droplet or droplets are deposited using an inkjet print head.

According to a second aspect of the present invention there is provided a light emissive device fabricated in accordance with a method according to the first aspect of the invention.

According to a third aspect of the present invention, there is provided a colour filter fabricated in accordance with a method according to the first aspect of the invention.

According to a fourth aspect of the present invention, there is provided an electronic device comprising a conductive interconnect fabricated in accordance with a method according to the first aspect of the invention.

According to a fifth aspect of the present invention, there is provided a display device comprising a colour filter in accordance with the second aspect and/or an optical filter in accordance with the third aspect and/or an electronic device in accordance with the fourth aspect.

According to a sixth aspect of the present invention, there is provided a method of manufacturing an electronic device comprising a method according to the first aspect.

BRIEF DESCRIPTION OF THE DRAWINGS

The present invention will now be described, by way of further example only, with reference to the accompanying drawings in which:

FIG. 20 is a schematic view of a mobile personal computer incorporating a display device fabricated in accordance with the patterning method of the present invention;

FIG. 21 is a schematic view of a mobile telephone incorporating a display device fabricated in accordance with the patterning method of the present invention; and FIG. 22 is a schematic view of a digital camera incorporating a display device fabricated in accordance with the patterning method of the present invention.

DETAILED DESCRIPTION OF EXEMPLARY EMBODIMENTS

Figure 1:
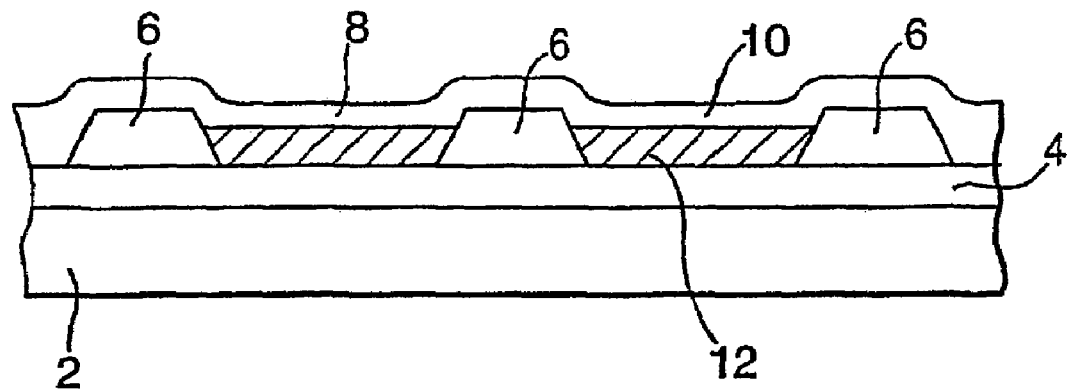
FIG. 1 is a schematic cross-sectional view of a static light emissive device.
Figure 3A:
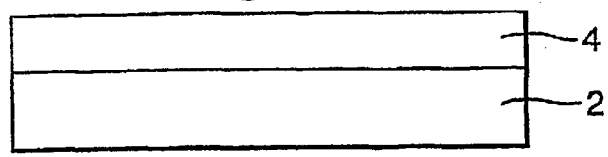
FIGS. 3A to 3C illustrate the steps of fabricating a light emissive device in accordance with an embodiment of the present invention.
Figure 3B:
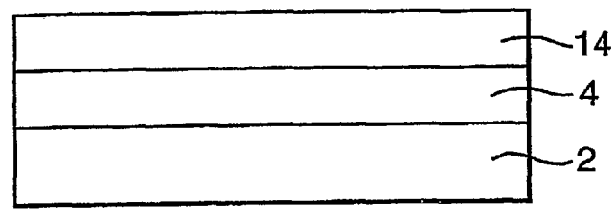
Figure 3C:
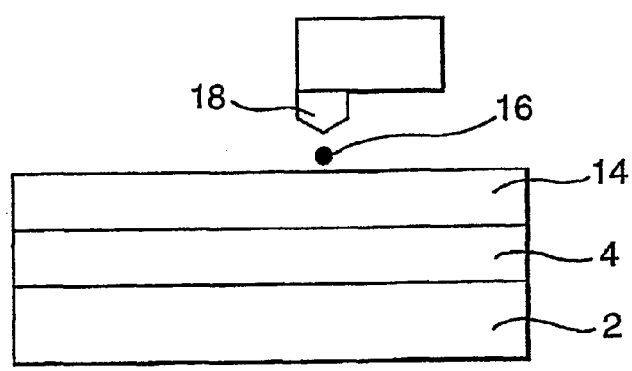

Referring to FIGS. 3A to 3C, the substrate 2 carries the conductive electrode layer 4, which may comprise ITO, in a similar manner to that described previously with respect to FIG. 1. An insulator layer 14, which is an insulating polymer and preferably comprises a polymer material containing alkyl chains and a benzene ring, such as for example, polystyrene or a co-polymer of polystyrene, is then deposited onto the conductive electrode by any suitable process such as by spin coating, as shown in FIG. 3B. The insulator layer 14 is deposited as a solution by dissolving the insulating polymer in a suitable solvent, preferably comprising an aromatic or chlorinated hydrocarbon solvent such as toluene, xylene, trimethylbenzene, tetramethylbenzene, cyclohexylbenezen, or mixture of them. A hole transporting layer can optionally be formed between the electrode layer and the insulator layer in order to improve carrier injection and blocking behaviour. The hole transporting layer is required to be insoluble in the solvent used for the insulator layer deposition. For example, poly-ethylenedioxythiophene (PEDOT), poly-pyrrole derivatives, or poly-aniline does not dissolve into toluene or xylene.

A light emissive conjugated polymer is then deposited onto the insulating layer as a series of droplets of a solvent solution of the conjugated polymer. One such droplet 16 is shown in FIG. 3B. Any suitable deposition apparatus can be used to deposit the series of droplets. An ink jet print head 18, as shown in FIG. 3C, is especially suited to this purpose as the head can be scanned in the longitudinal and transverse directions relative to the insulator layer 14 on the substrate enabling the light emissive polymer to be deposited in predefined and accurately controlled patterns.

The solvent for the conjugated polymer is selected so that it is also able to dissolve the material of the insulator layer 14. The solvent for the conjugated polymer may therefore be the same solvent used to provide the solution of the insulator layer. It should be appreciated, however, that a different solvent can be used as long as the solvent for the conjugated polymer is also able to dissolve the material for the insulator layer. Hence, for example, if the material of the insulator layer is polystyrene, as described above, xylene may be used to provide the solution for spin coating of the insulator layer whilst toluene may be used as the solvent for the light emissive conjugated polymer material. The conjugated polymer and the insulating polymer need to have at least one common solvent.

Because the solvent of a deposited droplet 20 is also able to dissolve the insulator layer material, a deposited droplet, once in contact with the insulator layer, will consist of a solution containing both conjugated polymer and insulating polymer. These are shown by the dashed and solid lines 22 and 24 in the droplet shown in FIG. 4.

The materials of the polymer insulator layer and the light emissive conjugated polymer are also selected so that phase separation occurs between the two polymer materials when the solution drop of the mixture dries and turns into a solid film.

The free energy change (G) of mixing consists of two terms: an enthalpy term (H) and an entropy term (S), the combinatorial entropy, as expressed by the following equation.

$$G = H - TS \qquad (1)$$

The enthalpy term arises from an interaction energy between the two components. The mixture of two polymers has a enthalpy:

$$H = Vzw\phi_1\phi_2/V_s \qquad (2)$$

where V is the total volume, z is a coordination number (the number of the most neighbouring molecules), w is an interaction energy given by $w=(\epsilon_{11}+\epsilon_{22})/2-\epsilon_{12}$, ($\epsilon_{ij}$ is the energy of a contact between components i and j), $\phi_i$ is the volume fraction of the component i, $V_s$ is an interacting segment volume. When w<0, the mixture is stable because G<0, and thus the phase separation does not occur. When w>0, the mixture has a increase of an enthalpy, but the stability of the mixture is determined by the free energy G involving the entropy term S as shown in equation (1). The entropy term of the mixture of two polymers is given by:

$$TS = kT(\phi_1 V/V_1 * ln\phi_1 + \phi_2 V/V_2 * ln\phi_2) \qquad (3)$$

where k is the Boltzmann constant, $V_i$ is the polymer volume of i. Compared to atoms or small molecules, polymers have much larger volume Vi and therefore the combinatorial entropy has a negligible contribution to the free energy of mixing. Consequently when polymers have enough molecular weight (Mw>1000) and the interaction energy w is positive, the two-components polymer system is unstable, the result of which is to cause the phase separation when the two-component mixture dries from the solution system. Furthermore the polymer system which has the larger molecular weight (Mw>50,000) and the interaction energy causes intense phase separation, which is desirable for this invention.

Figure 4:
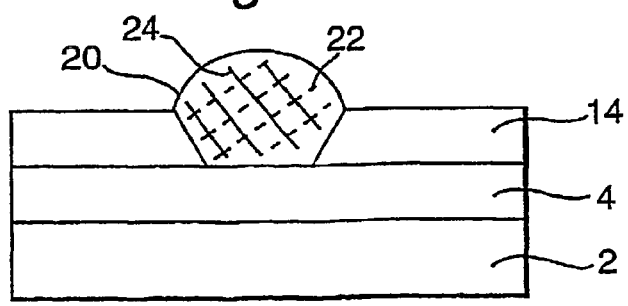
FIG. 4 shows schematically a cross-sectional view of a droplet deposited by the method illustrated in FIGS. 3A to 3C.
Figure 5A:
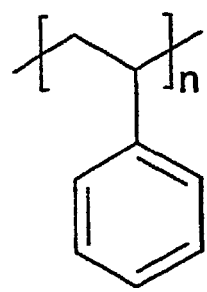
FIG. 5A shows the structure of an insulator polymer material suitable for use in the method of the present invention.
Figure 5B:
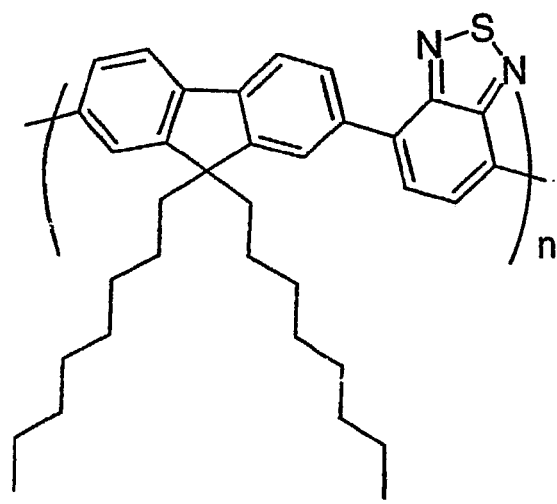
FIGS. 5B and 5C show respectively the structures of green and blue light emissive conjugated polymer materials suitable for use in the method of the present invention.
Figure 5C:
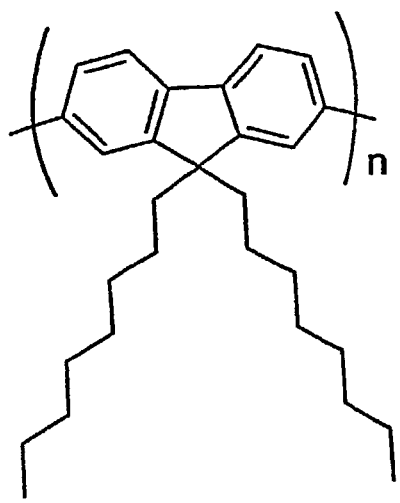
Figure 6:
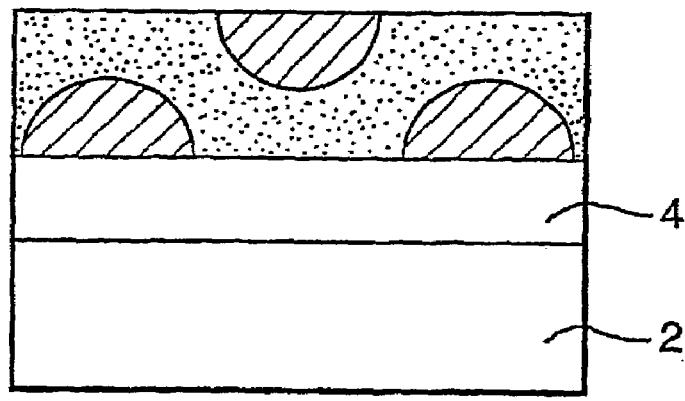
FIG. 6 shows a possible phase separated cross-sectional view of a dried droplet.

Polymers which might be used, for example, are shown in FIGS. 5A, 5B and 5C where FIG. 5A shows the structure for the insulator layer material polystyrene and FIGS. 5B and 5C show the structure for light emissive conjugated polymer materials. They all dissolve in aromatic hydrocarbon solvents such as toluene or xylene because they involve aromatic groups and alkyl chains. The main chain of polymers such as polystyrene in figure 5A consists of an alkyl chain, which is flexible and can take a large number of possible conformations, resulting in a coil-like structure. On the other hand, the main chain of the conjugate polymers such as F8BT (poly(9, 9-dioctylfluorene-co-2,1,3-benzothiadizole), which is a green light emissive polymer) and is shown in FIG. 5B, PFO (poly(9,9-dioctylfluorene), which is a blue light emissive polymer), and is shown in figure 5C, or CN-PPV (cyano-substituted poly(p-phenylene vinylene), which is a red light emissive polymer is conjugated along the chain, whereby electrons delocalise over the main chain, resulting in a rigid and rod-like chain structure. In the solid state, the two polymers do not dissolve into each other because their chain characters are so different that a large interaction energy arises and there is some decrease in the entropy term. Conjugated polymers generally have, at least in part, rigid rod-like chain structures and thus a polymer which has a coil-like chain is suitable for the insulator in terms of the intensity of phase separation. Hence, what would be expected in the droplet shown in FIG. 4 is a mixture of the two polymer materials and the solvent, but intense phase separation occurs between the two polymer materials as the solvent in the solution evaporates to leave a dried residue, giving rise to a dried deposit or residue in the form of a thin film containing distinct sub-domains of the two polymer materials. Even with the occurrence of phase separation it is possible that the dried residue could have a composition as shown in FIG. 6, in which one of the polymer materials dries as globules within the other polymer material, with only one of the materials extending continuously from the upper surface of the dried droplet film through to the underlying electrode.

Figure 7:
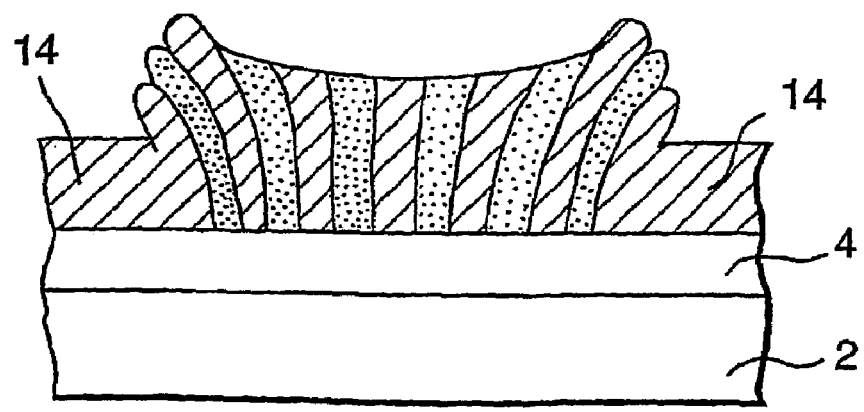
FIG. 7 shows a schematic phase separated cross-sectional view of a dried droplet created in accordance with the present invention.
Figure 8:
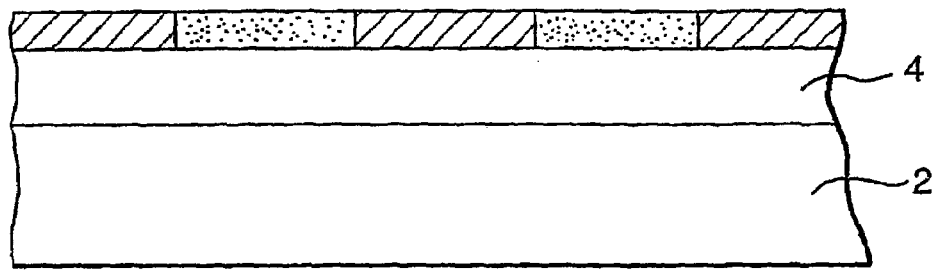
FIG. 8 shows a partial schematic cross-sectional view of the droplet shown in FIG. 7.
Figure 9:
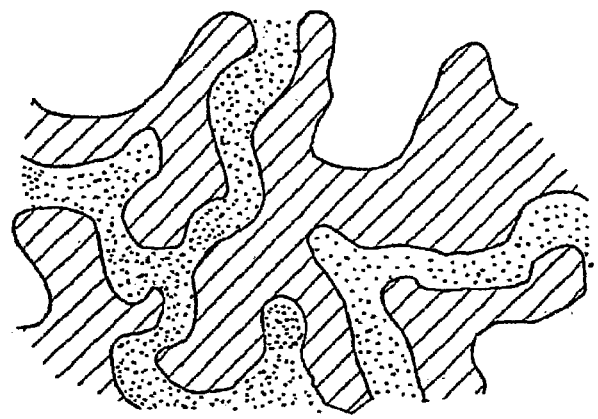
FIG. 9 shows a schematic plan view of the droplet shown in FIG. 7.

However, if the polymer materials are chosen to ensure that intense phase separation does occur when the droplet of solution dries and when the thickness of the residue is not very thick (<500 nm, the typical thickness is between 30 and 300 nm), it has unexpectedly been found that the dried residue invariably has a structure as shown in FIG. 7. The structure shown in FIG. 7 is believed to be formed because the phase separation occurring between the two polymer materials tends to minimize the interface between the two materials. A cross-section of a thin layer of the residue actually has an appearance as shown in FIG. 8 and a typical plan view of a dried droplet, when viewed under a microscope, typically has an appearance as shown in FIG. 9, with very distinct sub-domains of the two polymer materials. Here each polymer material penetrates the whole film from the bottom to the top in one domain. The domain size showing in FIG. 9 is from 0.5 micron to 10 microns when the drying time takes from about a few hundred milliseconds to about 10 seconds.

It was believed that when a drop of solution of a conjugated polymer is deposited onto an insulator, a bi-layer consisting of a bottom insulator layer and a top conjugated polymer layer is formed, or a layer of the mixture of the insulator and conjugated polymer is formed. If the bi-layer is formed, it cannot function as a light emissive device because the light emissive polymer would remain electrically isolated from one of the electrodes. Furthermore, if a layer of the mixture is formed, the conjugated polymer with a large amount of the impurity of the insulator cannot be expected to have good characteristics as a light emissive device.

As mentioned above, one of the polymer materials is chosen to be an insulator material and it has further been found that, if the original layer of polymer material 14 which has been deposited on the electrode layer 4 is the insulator material, the insulator material which is dissolved into the deposited droplet 16 tends to migrate within a deposited droplet towards the edge regions of the droplet. When the droplet is dried through evaporation of the solvent, there is more insulator material towards the edge of the dried droplet than in the centre region of the dried droplet.

Figure 10:
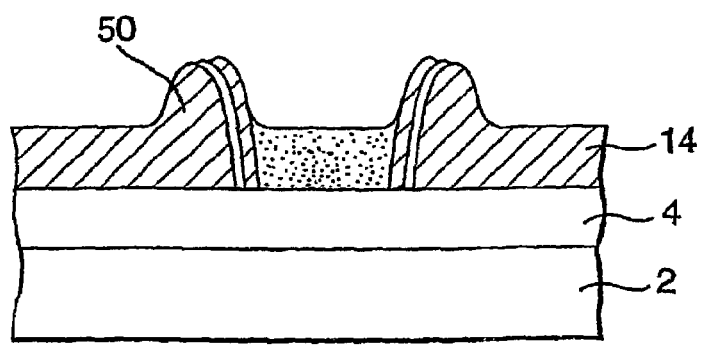
FIG. 10 shows a schematic cross-sectional view of a dried droplet fabricated by depositing an increased number of droplets of solution of light emissive polymer material.

Moreover, it has also been found with the present invention that if subsequent droplets are deposited, the insulator polymer material can be caused to migrate to the edge of the dried droplet to provide a structure as shown in FIG. 10, with the centre region of the dried droplet comprising almost essentially the light emissive polymer material. Hence, the distribution density of the insulator and light emissive polymer material within a domain can be controlled by controlling the number of droplets deposited. This migration within a deposited droplet will now be described with reference to FIGS. 11 and 12.

A deposited droplet of the solution of the conjugated polymer material, such as the droplet 16 shown in FIG. 3C, spreads over the predeposited layer of polymer insulator material and assumes a diameter determined by the surface tension (surface free energy density) of the droplet and the insulator material 1 respectively and the interfacial tension (interface free energy density) between the droplet and insulator material.

After the solvent in the droplet has evaporated, the cross-sectional profile of the residue 16 of the first material deposited on the substrate is unexpected. This profile is not a hemispheric profile as may be expected, but a ring-shaped profile, such as shown in FIG. 7, where it can be seen that a ridge is formed around the perimeter and a relatively thin film or layer is formed in the centre region, bounded by the ridge.

Figure 11A:
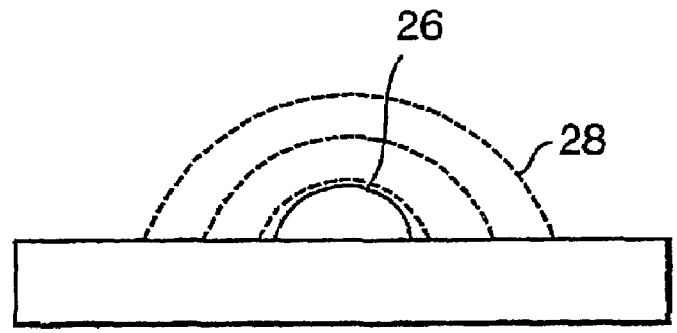
FIG. 11A-11C shows the three types of dried droplet which may be obtained by depositing solutions of organic polymer materials onto a receiving surface.

The shape of the dried droplet and the sub domains of the insulator material and of conjugated polymer material are affected by a number of factors, including the properties of the solutions of the respective materials and the drying conditions, as will now be explained. It has been found that when a droplet of an organic polymer in solution is deposited on a surface, there are at least three deposition modes, as shown in FIG. 11, each of which results in a different cross-sectional profile of the remaining film of solute (the organic polymer material) on the surface after the solvent has evaporated. The first deposition mode may be termed shrink type deposition and is shown in FIG. 11(a). In this mode, the lateral size or diameter of the dried solute 28 is smaller than the diameter of liquid droplet 28 of solution when first deposited on the surface, the outline of which is shown as the outermost dotted line in FIG. 11(a). This means the droplet 28 has shrunk during drying. Shrink type deposition has been found to occur when the contact angle of the droplet 28 is relatively large (for example, greater than 40°) and when wetting of the receiving surface by the deposited solution is relatively poor. The deposition of a droplet of an aqueous solution onto a hydrophobic surface is an example of shrink type deposition, because of the large contact angle of the droplet with the surface and the non-wetting properties of water on the surface. Thus, for example, when a water-based PEDOT solution is deposited onto a polystyrene film, this shrink type deposition is observed.

Figure 11B:
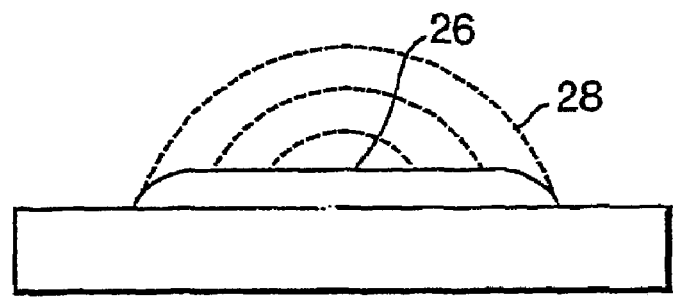

The second mode is mesa type deposition and is shown in FIG. 11(b). In this mode, a small amount of shrinkage of the droplet 28 during drying can also be observed. However, in contrast with shrink type deposition, deposition of the solute occurs during shrinking. As a result, the deposited film 26 has a mesa-shaped profile and a diameter almost the same size as the initial diameter of the droplet 28 of solution. Mesa type deposition has been found to occur when the surface tension of the solution is high (for example, greater than 30 mJ/m$^2$) and when the solution can wet the surface on which it is deposited. Mesa type deposition may occur when an aqueous solution is deposited onto a hydrophilic surface or an inorganic substrate, since water has a high surface tension and good wetting properties with respect to a hydrophilic surface. When a water-based PEDOT solution is deposited onto a glass substrate, for example, mesa type deposition may be observed. PEDOT is a conductive polymer and hence, if the lower electrode is fabricated as patterns of individual electrodes on glass using such a conductive polymer, as is subsequently described with reference to FIGS. 14(a) and 15, such mesa type deposition would be observed.

Figure 11C:
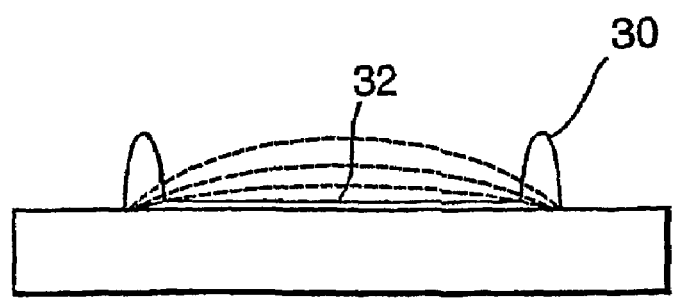

The last mode is ring type deposition and is shown in FIG. 11(c). The film resulting from this type of deposition may be equated with the film of residue left after coffee is spilt on a solid surface. In ring type deposition 28 most of the solute is deposited at the edge of the droplet 10, thereby providing a ridge 30 of the solute around the edge and a thin film 32 of the solute in the centre region. Ring type deposition can occur when the contact angle is relatively small (for example, less than 30° and preferably less than 20°) and when wetting of the solution on the receiving surface is relatively good. For ring type deposition, the contact line of the droplet on the receiving surface is pinned and does not move during drying. This means the contact angle decreases as the droplet 10 dries. This can occur when the surface tension of the solution is low (for example, less than 30 mJ/m$^2$).

Figure 12:
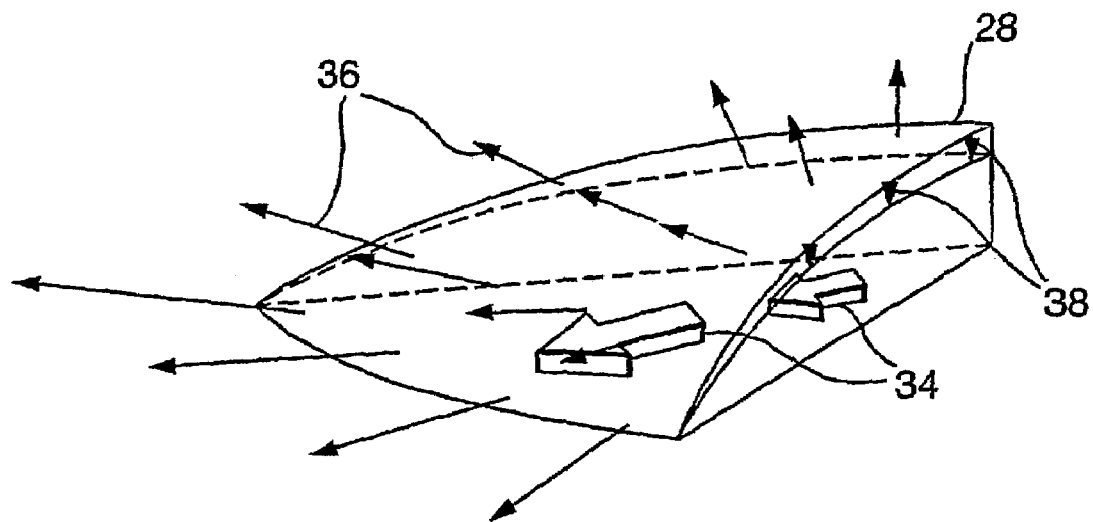
FIG. 12 shows schematically the flow currents which occur during the drying process of a droplet of a solution of organic polymer material deposited onto a receiving surface.

An internal fluid flow 34 is caused in the pinned droplet 28 by enhanced evaporation and volume effects 36 and 38 respectively, as illustrated schematically in FIG. 12. The enhanced evaporation effect 36 is caused by a difference in the speed of evaporation of the solvent at the edge and centre regions of the droplet 28 respectively. A higher evaporation rate is observed in the edge region than in the centre region because solvent molecules escape more easily from the edge region. The internal flow 34 of fluid within the droplet 10 takes place so as to compensate this difference. However, since the contact line is pinned and the volume of the droplet is decreasing, the shape of the droplet changes. Thus, the volume change in the edge region is smaller than that in the centre region, as shown in FIG. 11(c) or FIG. 12. This difference in the change of volume at the edge and centre regions respectively also causes internal flow. Accordingly, due to these two effects, an internal flow from the centre to the edge occurs in a droplet drying on a receiving surface in this deposition mode.

This internal flow 34 carries solute in the solution from the centre to the edge. An increased evaporation speed also increases the velocity of the internal flow 30, so a high evaporation speed can be used to enhance the migration of the solute within the droplet. The evaporation speed can be increased, for example, by using a low boiling point solvent, by raising the temperature during drying or by lowering solvent vapour pressure around the droplet. A stream of gas (for example, dry air, nitrogen or argon) passed over the structure effectively lowers this pressure, resulting in enhanced evaporation speed. These techniques can be used alone or in combination.

With the present invention, the solution comprises the solvent, the insulator polymer material and the light emissive polymer material. The deposited droplet shown in FIG. 4 exhibits a pinned contact line. Such internal flow, as shown in FIG. 12, occurs therefore in the droplet 20 shown in FIG. 4. The insulator polymer and conjugated light emissive polymer are selected to exhibit phase separation upon drying. However, the fluid flow has surprisingly been found to have a greater effect on the insulator polymer material than on the light emissive polymer material, and hence, has unexpectedly been found to contribute to the rapid migration of the insulator polymer material to the edge of the dried droplet, thereby providing the light emissive domain structure shown in FIG. 10. This rapid migration of the insulator polymer to the edge of the dried droplet is a most unexpected effect and it has been realized that this phenomenon may be used advantageously to provide an effective low cost light emissive device.

Figure 13:
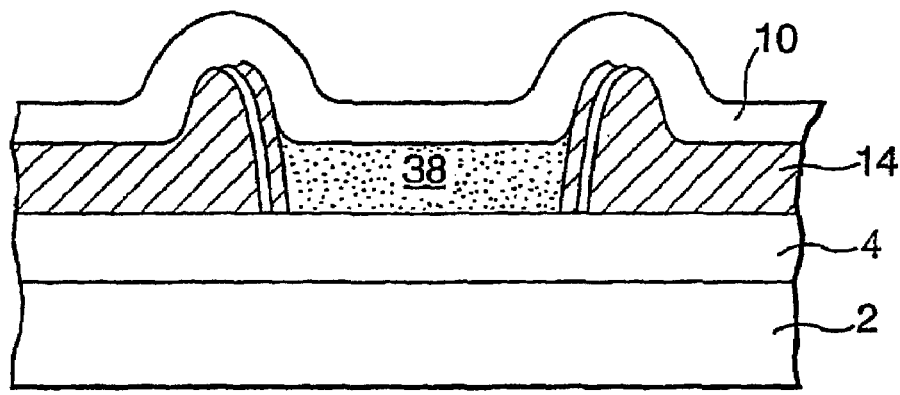
FIG. 13 shows a cross-sectional view of the structure shown in FIG. 10 but including a top electrode.

It will be realized that the structure shown in FIG. 10 can be usefully employed as a light emissive device with the deposition of the second electrode to overlie the resultant structure, as shown in FIG. 13. This is because the central domain of the dried droplet consists exclusively of the light emissive polymer material extending down into contact with the first electrode 4. Hence, if a suitable voltage is applied between the electrodes 4 and 10 of the structure shown in FIG. 13, the current flowing from one electrode to the other will flow mainly in the central domain 38 because the structure consists, essentially, of the conductive central domain surrounded by the insulator material 14. The central domain 38 will, therefore, emit light. Preferably, the droplets are deposited so as to provide domains which are circular in shape.

By selectively depositing the droplets 16 in predefined patterns over the substrate it will be appreciated that light emissive patterns can readily be created at relatively low cost. Furthermore, because the droplets are deposited by an inkjet print head, such as the head 18 shown in FIG. 3. the process lends itself readily to large area processing, so large or small scale static displays can be fabricated in an efficient manner.

Figure 2:
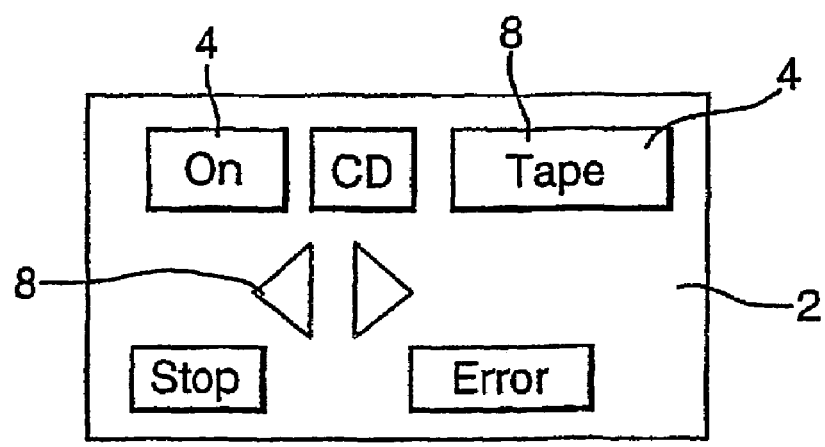
FIG. 2 is a schematic representation of a static display device incorporating the light emissive device illustrated in FIG. 1.

The upper electrode 10 may comprise any suitable conductive material, such as a bi-layer of aluminum and calcium or of aluminum and LiF or tri-layer of LiF, calcium and aluminum fabricated by evaporation deposition, or it may comprise a conductive polymer material, which may be deposited in solution by spin coating. If several isolated domains are created on the substrate to a predefined pattern, such as would be required to create the display shown in FIG. 2, all of the conductive interconnects can be made to the individual light emissive domains with a single process step, providing efficient fabrication.

It will also be realized that different conducting light emissive polymers can be used to create the various light emissive domains. Hence, for example, the 'STOP' message shown in FIG. 2 may be fabricated by a polymer which will emit red light whilst the 'forward' and 'back' symbols may be fabricated with a polymer which will emit green light. Therefore, a multicolour fixed pattern display can be readily and efficiently created, which is extremely difficult to achieve with a spin coating technique.

In the fabrication method which has been described with reference to FIG. 13, the lower electrode 4 is formed as a continuous single electrode. Hence, if several of the domains 38 are present in a display and a voltage is applied between the electrodes 4 and 10, all of the domains would emit light simultaneously, irrespective of the colour of the emitted light.

However, because the light emissive polymer is selectively deposited as droplets under fine control using an inkjet print head, either the electrode 4 and/or the electrode 10 may be fabricated as patterns of individual electrodes which are electrically isolated from each other. An example is shown in FIG. 14, where four patterns 4A to 4D are provided to act as individually selectable electrodes for use in an instrument panel of a motor vehicle, with symbols of fuel and temperature gauges 40, 42 being arranged for simultaneous indication by the application of a voltage to the electrode pattern 4A and warning messages 44, 46, 48 for key systems being individually selectable by the application of a voltage on respective electrode patterns 4B, 4C and 4D.

Figure 14:
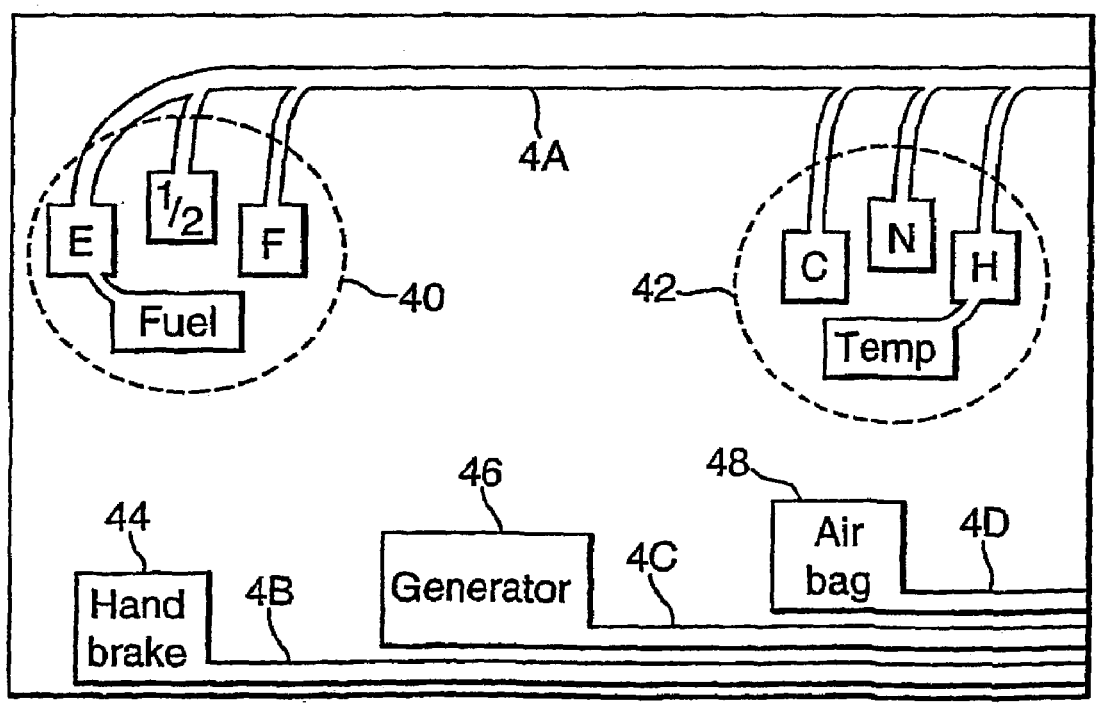
FIG. 14 shows a schematic representation of a device in which a lower electrode comprises a plurality of electrode patterns.

It will be appreciated from FIG. 14 that because the light emissive polymers are deposited by an inkjet print head under computer control the letters and numerals of such a display can be easily fabricated with good image definition; such as, for example, the letters 'E' and 'F' for the fuel gauge 40.

Figure 15:
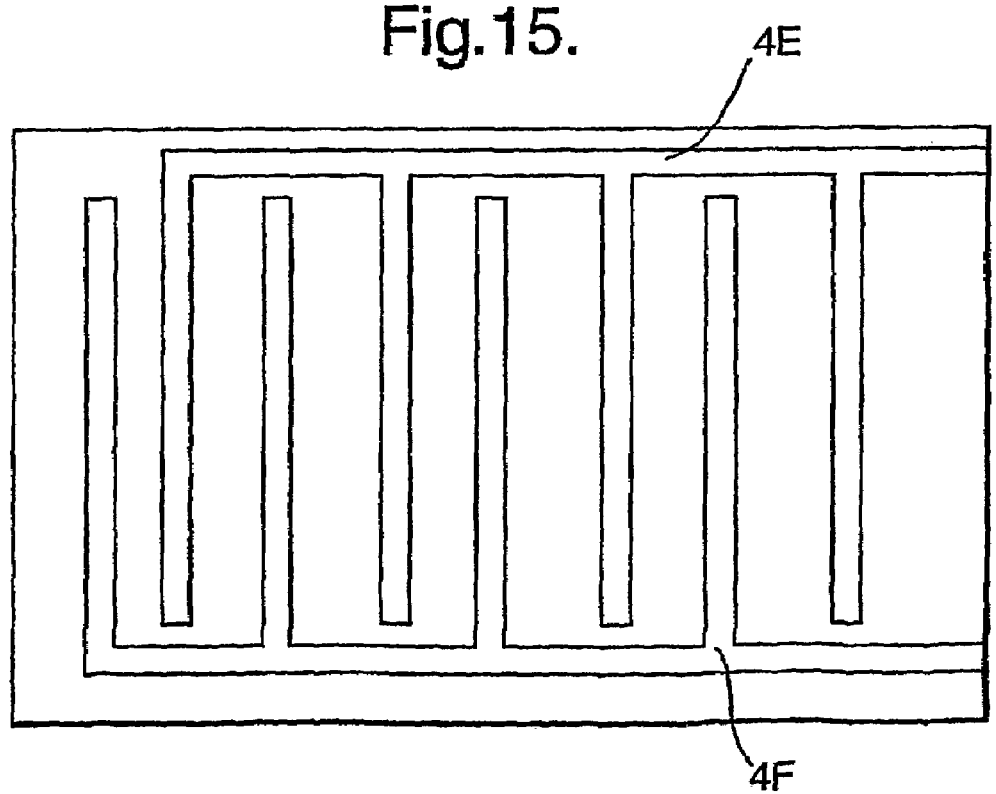
FIG. 15 shows a schematic representation of a lower electrode comprising interdigitated electrode patterns.

The lower electrode 4 may also be fabricated as interdigitated patterns; two such patterns 4E and 4F are shown in FIG. 15. The patterns 4E and 4F can be energized individually and because the light emissive polymer materials are deposited by an ink jet head under fine control, a first pattern of the light emissive polymer materials may be deposited so as to provide the domains extending into contact with the one of the patterns, such as 4E, and a second pattern of the light emissive polymer materials may be deposited to provide the domains extending into contact with the second of the interdigitated patterns.

Each of the patterns of the light emissive polymer materials may comprise red, blue and green emissive materials and is not limited to a light emissive material of a single colour. By appropriately controlling the light emissive polymer material as the solute for the droplets 16, as shown in FIG. 3c, a patterned matrix array of the light emissive materials providing red, green and blue light emission may be fabricated for each of the interdigitated electrodes. Hence, by applying a voltage to one of the electrodes, for example electrode 4E, one multi-colour image may be displayed, and by applying a voltage to the other electrode 4F, another multi-colour image may be displayed. By careful control of the fabrication of the interdigitated electrode patterns, it has been found that three of such patterns can be provided on the substrate, each having a respective patterned matrix array of the light emissive polymer materials. The display may therefore be used to provide three different fall display multi-colour picture quality images merely by the serial selective application of a voltage to the interdigitated electrodes.

The interdigitated electrodes may be fabricated from any suitable conductive material, such as ITO or a conductive polymer material. For selected materials, such as a conductive polymer, for example PEDOT, the interdigitated electrodes may be fabricated using droplet deposition from an ink jet print head as an alternative to using shadow masks or a photolithographic process.

Because the multi-image display can also be fabricated without the use of shadow masks or photolithography, it also lends itself to relatively large area processing and hence the method of the present invention can provide relatively low cost, relatively large area, multi-image, multi-colour, picture quality displays which can be used, for example, as advertising displays. Furthermore, such multi-image displays can also be used effectively in a display such as shown in FIG. 14. The warning messages 44, 46, 48 shown in FIG. 14 could, for example, be created in a common area of the device on a single compact three pattern interdigitated type electrode pattern, with the appropriate message being indicated by the application of a voltage to the respective interdigitated electrode of the pattern providing a more compact display without reducing the quantity of information which can be displayed.

The fabrication of the light emissive areas of the device through the use of an inkjet print head gives rise to a further advantage in comparison to the use of a spin coating technique. It has already been mentioned above that the use of a spin coating technique would, in practice, only lend itself to the fabrication of monochrome displays, whereas the present invention can also be readily used to fabricate multicolour displays. However, if the light emissive polymer is deposited into selected areas by spin coating, the thickness or the composition of the emissive polymer areas so deposited cannot be readily controlled from area to area of the device. In practice, the spin coating process provides light emissive areas of substantially the same thickness and composition over the entire area of the display.

Figure 16:
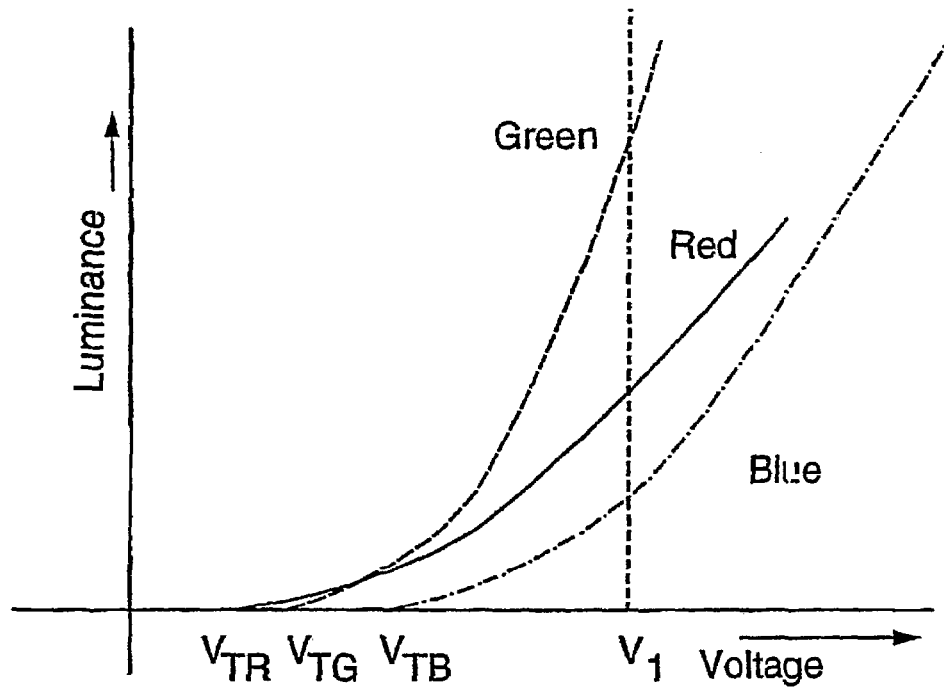
FIG. 16 shows a plot of the luminance characteristics for typical red, blue and green light emissive polymers.
Figure 17:
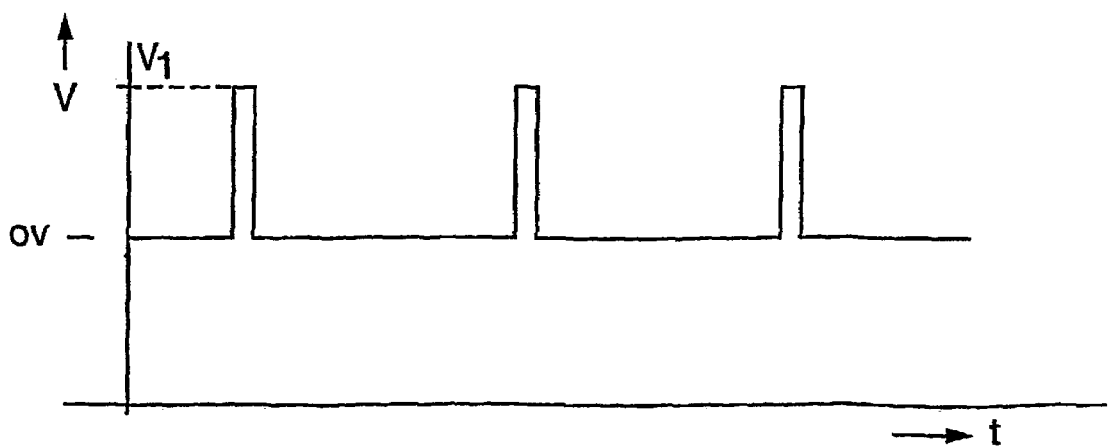
FIG. 17 shows a typical voltage drive waveform for driving a multicolour light emissive polymer display device.

The luminance characteristics for typical red, green and blue light emissive polymer materials are shown in FIG. 16. It can be seen from this figure that the threshold voltage, that is, the voltage that would need to be applied between the electrodes 4 and 10 of the device shown in FIG. 13 for the domain 38 to emit light, for a red colour emissive polymer $V_{TR}$ is lower than that for a green colour emissive polymer $V_{TG}$, which is lower than that for a blue colour emissive polymer $V_{TB}$. Typical threshold voltages for the three polymers are:—

$V_{TR}$=2 Volts; $V_{TG}$=2.2 Volts; $V_{TB}$=3 Volts

The human eye is most sensitive to green light. This is why the green emissive polymer material has a luminance characteristic which rises most steeply with an applied voltage, as can be seen from FIG. 16. It can also be seen from FIG. 16 that depending on the applied voltage, the difference in luminance, i.e. the perceived brightness, between the three colours changes.

The brightness can be controlled in three main ways:— a) by varying the thickness of the light emissive domain—the polymer materials are current driven, so if the thickness is increased the current reduces and hence the domain appears less bright;

b) by varying the area of the light emissive domain—the area is reduced to give a darker appearance;

c) by varying the driving technique—varying the amplitude and/or duration of the voltage pulses used to drive the light emissive domains.

In practice, for a multicolour display containing red, green and blue emissive polymers, a relatively high drive voltage, usually at least 10 volts, is used because the difference in the luminance of the three polymers, due to the variation in the threshold voltages, becomes less noticeable. The typical operating voltage is shown by the voltage $V_1$ in FIG. 16.

However, because a relatively high voltage is used, the duration of the pulses is reduced to avoid burn out of the light emissive domains due to a high DC current.

The size of the emissive region can be controlled by the volume of a deposited drop. It is possible to change the volume of a drop by modifying the driving condition of the inkjet head. Successive deposition of drops before drying can be also used to increase the size of emissive regions and/or to control the distribution density of the light emissive and insulator materials within a domain, i.e. the proportion of the area of the domain which comprises the light emissive material and the proportion of the area of the domain which comprises the insulator material.

Therefore, with the present invention the luminance of the light emissive domains can be readily controlled through the deposition of the droplets.

Referring again to FIGS. 7, 9, 10 and 13, when a droplet of a solution of the light emissive polymer is deposited onto the layer of insulator polymer material and allowed to dry, the resulting dried droplet unexpectedly has an appearance as shown in FIGS. 7 and 9, containing individual respective sub-domains of the insulator and light emissive polymer materials. If such a dried droplet is arranged between a pair of electrodes and a voltage is applied, only the sub-domains of the light emissive material will emit light.

However, if further droplets are deposited onto the initially deposited droplet, it has been found that the insulator polymer rapidly migrates to the edges of the droplet and when dry, the dried droplet has an appearance as shown in FIG. 10, with a large central domain containing almost exclusively the light emissive polymer material and a small number of very narrow sub-domains of the light emissive material located towards the edge of the dried droplet. The insulator material of the layer 14 which is dissolved by the solvent of the deposited droplets migrates relatively quickly to the edges of the dried droplets to form a ridge area 50, shown in FIG. 10. It can be appreciated that if the same voltage referred to above in relation to FIG. 9 is applied to the structure shown in FIG. 13, for the same area of dried droplet, the structure shown in FIG. 9, containing relatively large areas of sub-domains of the non-emissive insulator polymer material, would emit less light than the structure shown in FIG. 13. Surprisingly, in practice it has been found with the present invention that a relatively small number droplets are required to be deposited in order to transform a dried droplet from the sub-domain type structure shown in FIG. 9 to the domain type structure shown in FIG. 13. If further droplets are deposited the large central domain can be made thicker, again reducing the emission luminance. Alternatively, the droplet position can be controlled to increase the size of the central domain, increasing the emission luminance.

It will be appreciated therefore that the variation in the light emissive properties of the red, green and blue light emissive polymer materials may be equalized or varied by controlling the number of droplets deposited to create the light emissive domains for the various colours used.

For example, if a device was required including red and blue light emissive domains, a smaller number of droplets can be used to create the red emissive domains (leaving sub-domains of the insulator to reduce light emission) than are used to create the blue emissive domains (leaving very few sub-domains of the insulator material).

This aspect of the present invention is considered to be particularly advantageous as it enables a multicolour display to be realized with perceptively even luminance from the respective colour light emissive polymers without the need for a relatively high operating voltage.

This aspect of the invention can also be used to vary the intensity of light emission in any one colour of a display. In this manner, and taking red colour areas of a display as an example, a red emissive domain in the centre area of a display may be created to provide a lower luminance level than red domains located towards fringe areas of the display in order to compensate for possible non uniformity across the field of vision of a viewer of the display. It is therefore possible to create gradation or grayscale effects in or between any of the colours emitted by the device.

This ability to provide grayscale for any colour to be emitted by the device is considered to be particularly useful for efficient fabrication of displays in which the provision of even illumination intensity across all areas of the display is found to be particularly problematical with known illumination techniques, such as instrument displays used in vehicles and aircraft. With the gradation of colours, it is possible to achieve a photo-grade static display, which cannot be obtained by the known conventional techniques.

In the preferred embodiment described above the deposited droplets comprise a solution of a light emissive polymer in a solvent and the pre-deposited polymer layer is an insulator polymer material. However, these two types of polymer material may also be interposed so that a solution of the insulator polymer material is deposited as a series of droplets onto a predefined emissive polymer layer to provide a device having non-emissive areas against an emissive background (in essence, a negative of the image provided by the preferred embodiments previously described).

Furthermore, whilst displays featuring red, green and blue emissive areas have been described, emissive polymers capable of emitting light of other colours, including white light, can also be used.

Moreover, the light emissive domains may be fabricated so as to comprise a mixture of red, green and blue emissive domains in close proximity to each other so as to provide a domain having the appearance of any required colour to a viewer of the device.

The light emissive polymer may be a polymer which comprises the groups involving at least one of fluorene, p-phenyl, p-phenylene vinylene, thiophene, benzothiadizole, or triarylamine in the main chain or in the side chain. The conjugated polymer which comprises these groups is most suitable for the light emissive polymer. The light emissive polymer may involve alkyl chains to be soluble in hydrocarbon solvents, especially in aromatic hydrocarbon solvents such as toluene, xylene, trimethylbenzene, tetramethylbenzene, cyclohexylbenzene, or any mixuture of them.

For the insulator, many insulator polymers are known. Among them, the polymers soluble in hydrocarbon solvents, especially in aromatic hydrocarbon solvents, are more desirable. Such a polymer consists of alkyl chains and aromatic groups.

The method of the present invention can also be used advantageously to fabricate devices other than light emissive devices. The domains of the second polymer material are embedded in and surrounded by the layer of the first polymer material. Furthermore, the domains of the second polymer material extend through the layer of the first polymer material. These characteristics of the domains are beneficial in a light emissive device because the light emissive material can be fabricated in electrical contact with the electrodes used to apply a drive voltage to the material so that it is able to emit light.

Figure 18:
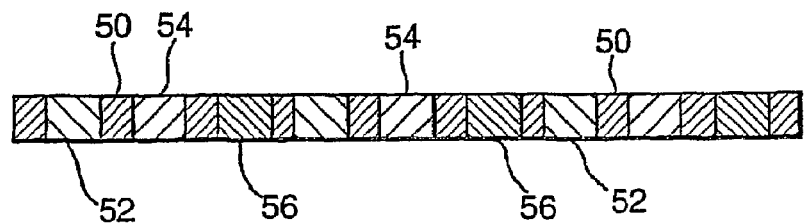
FIG. 18 shows a schematic cross-sectional view of a colour filter fabricated in accordance with the method of the present invention.

Moreover, because the domains are embedded in the layer of the first polymer material and have been formed by dissolving selected areas of the continuous layer of the first material, there are no pinholes extending through either the domains or the first material or the interface therebetween. Hence, when the second electrode is deposited, short circuits do not occur between the first and second electrodes. Such a basic structure of domains of one material extending through but embedded in and surrounded by another material can also be used to advantage to fabricate optical filters and in particular optical colour filters, an example of which is shown in FIG. 18. The method of the present invention can therefore be used advantageously to fabricate such filters.

The colour filter shown in FIG. 18 comprises substantially opaque areas 50 of a polymer material which does not transmit visible light in which are embedded transmissive areas 52, 54 and 56 which can transmit, respectively, green, blue and red light. Materials capable of transmitting other colours may also be used. The colour filter can therefore be readily fabricated by providing a layer of the opaque polymer material on a substrate and then selectively depositing, preferably using an inkjet head, droplets of coloured polymer solutions, such as green, blue and red transmissive polymer solutions in a similar manner as described above with respect to the light emissive device. When the solvent in the drops dissolves the polymer layer and when the phase separation occurs between the two polymers, the coloured polymer can be embedded in the polymer layer. The polymer layer can be opaque, in this case, this polymer acts as a shadow mask and the deposited colour polymer gives a colour window in that, similar to a stained glass effect. Because the light transmissive areas have been fabricated by dissolving the polymer layer, with the migration of the material of the polymer layer within the deposited droplets and phase separation upon drying, pinholes either in the light transmissive domains or at the interfaces between the domains and the opaque material do not occur. The light transmissive areas can be fabricated with extreme accuracy using an inkjet print head under computer control and the optical filter may be used, for example, as a colour filter in a display device, such as a liquid crystal display, or to provide decorative effects.

Vertical interconnection is another example where the method of the present invention can be used to advantage. Drops of conducting polymer solution are deposited onto an insulator layer on a substrate. When the solvent in the drops dissolves the insulator layer and when the phase separation occurs between the two polymers, the conducting polymer can be embedded in the insulator layer. This is useful to connect one electrode to the other electrode separated by an insulator layer. With this technique one can fabricate three-dimensional conducting structures, which is required in integrated circuit, circuit board, multi-layered passive electric devices, or hybrid ICs. For the conducting and insulator polymer, for example, PEDOT and polyvinylalcohol (PVA) can be used, respectively.

Figure 19:
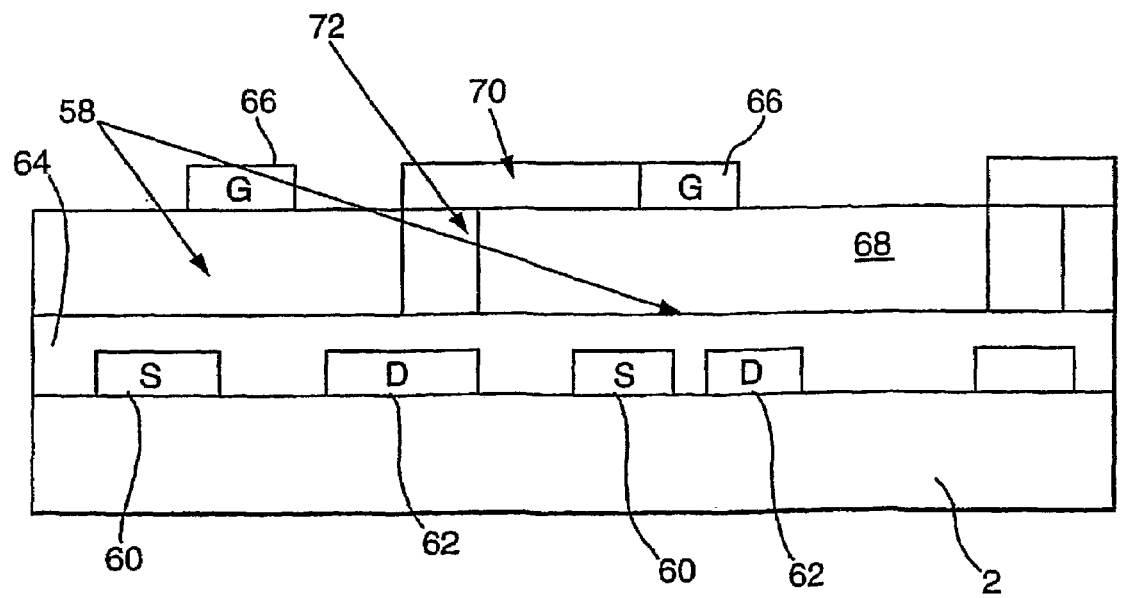
FIG. 19 shows a schematic cross-sectional view of an electronic device in the form of an integrated circuit including a conductive interconnect fabricated in accordance with the method of the present invention.

An example of such a device is shown in FIG. 19. The device shown in FIG. 19 includes thin film transistors 58 each having a source and a drain region 60, 62 formed in a semiconductor layer 64, and a gate electrode 66. The gate electrodes are separated from the semi-conductor layer by a thin layer of insulator 68 and are electrically coupled to the semiconductor layer by horizontal conductive interconnections 70 and vertical interconnections (via holes) 72. It will be appreciated that if the insulator 68 comprises a polymer material, the vertical interconnects can be fabricated using the method of the present invention. Furthermore, the horizontal interconnects between the conductive vertical interconnects and the gate electrodes can also be fabricated using an inkjet head. The method of the present invention can also be used to fabricate such vertical interconnects between various horizontal interconnection patterns within the integrated circuit.

Integrated circuits including vertical interconnects fabricated by the method of the present invention can also be used in display devices, such as a liquid crystal display.

As described above, the method of the present invention can be applied to manufacture of an electronic device such as an electrooptical or display device, a semiconductor device and other electronic devices. The electrooptical devices preferably include a liquid crystal device, an organic electroluminescent device, an inorganic electroluminescent device, a field-emission device (FED), a plasma device, an electrophoretic device, and other display devices. In particular, the method of the present invention can be also preferably applied to the manufacture of pixel circuits, driver circuits, and/or some wirings formed in an active or passive matrix substrate used in the above electronic devices and/or a manufacture of functional layers in the form of one or more patterns such as light emitting layers of an electroluminescent device.

Various electronic apparatuses using display devices fabricated in accordance with the present invention will now be described.

Mobile Computer

An example in which the display device fabricated in accordance with one of the above embodiments is applied to a mobile personal computer will now be described.

FIG. 20 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the present invention, as described above.

Portable Phone

Next, an example in which the display device is applied to a display section of a portable phone will be described. FIG. 21 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device according to the present invention, as described above.

Digital Still Camera

Next, a digital still camera using an OEL display device as a finder will be described. FIG. 22 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 20, the portable phone shown in FIG. 21, and the digital still camera shown in FIG. 22, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied not only to display sections of these electronic apparatuses but also to any other form of apparatus which incorporates a display section.

Furthermore, the display devices fabricated in accordance with the present invention are also suitable for a screen-type large area TV which is very thin, flexible and light. It is possible to paste such large area TV on a wall, or to hang on a wall. The flexible TV can be rolled up when it is not used.

The aforegoing description has been given by way of example only and it will be appreciated by a person skilled in the art that modifications can be made without departing from the scope of the present invention. For example, a person skilled in the art will appreciate that a wide variety and various combinations of substrates, pre-patterning materials and target materials, individually and together and including non polymer materials can be selected. In addition, it will be appreciated that a variety of shapes, sizes and patterns of pre-patterning material can be used. It will, for example, be further appreciated that selected lines of a second target material, bounded on either side, can be provided either using a single line of a first pre-patterning material, which is wetting with respect to the second target material, or using two lines of a first pre-patterning material, which is non-wetting with respect to the second target material.

The invention claimed is:

1. A patterning method for manufacturing a device including a first electrode, a second electrode, an insulator material positioned between the first and second electrodes, and a first light emissive polymer material positioned between the first and second electrodes so that a current flows between the first and second electrodes via the first light emissive polymer material, the insulator material being a non-emissive insulator polymer material and the first light emissive polymer material being surrounded by a first ridge area of the insulator material, the method comprising:

forming the insulator material on the first electrode;

discharging a first droplet onto a first portion of the insulator material, the first droplet including the first light emissive polymer material, the first droplet dissolving the first portion of the insulator material, the insulator material and the first light emissive polymer material being separated by a phase separation phenomenon such that the first light emissive polymer material is surrounded by the first ridge area of the insulator material after the phase separation phenomenon occurs; and forming a second electrode on the insulator material and the first light emissive polymer material.

2. The method according to claim 1, the first light emissive polymer material including a chain with a coil structure.

3. The method according to claim 1, the first light emissive polymer material including a chain with a rod structure.

4. The method according to claim 1, the ridge area of the insulator material being configured to function as a bank structure after the phase separation phenomenon occurs.

5. The method according to claim 1, further comprising:

discharging a further droplet onto a further portion of the insulator material before the forming of the second electrode, the further droplet including a further light emissive polymer material that emits light of a different colour from light emitted by the first light emissive polymer material, wherein the further droplet dissolves the further portion of the insulator material, and the insulator material and the further light emissive polymer material are separated by a phase separation phenomenon, such that the further light emissive polymer material is surrounded by a second ridge area of the insulator material after the phase separation phenomenon occurs.

6. The method according to claim 1, the first electrode including a conductive polymer material.

7. The method according to claim 1, the insulator material being formed by a spin coating method.

8. The method according to claim 1, the first light emissive polymer material including a semi-conducting material that includes fluorine groups in a main chain of a molecule of the first light emissive polymer material.

9. The method according to claim 1, the first light emissive polymer material including a semi-conducting material that includes p-phenyl groups in a main chain of a molecule of the first light emissive polymer material.

10. The method according to claim 1, the first light emissive polymer material including a semi-conducting material that includes p-phenylene vinylene groups in a main chain of a molecule of the first light emissive polymer material.

11. The method according to claim 1, the first light emissive polymer material including a semi-conducting material that includes thiophene groups in a main chain of a molecule of the first light emissive polymer material.

12. The method according to claim 1, the first light emissive polymer material including alkyl chains and a benzene ring.

13. The method according to claim 1, the non-emissive insulator polymer material including polystyrene or a co-polymer of polystyrene.

14. The method according to claim 1, the first droplet including at least one of an aromatic solvent and a chlorinated hydrocarbon solvent.

15. The method according to claim 1, each of the first light emissive polymer material and the non-emissive insulator polymer material having a molecular weight of more than 1000.

16. The method according to claim 5, a size of the first droplet and a size of the further droplet being selectively controlled.

17. The method according to claim 5, the first and further droplets being discharged from an inkjet print head.

* * * * *

UNITED STATES PATENT AND TRADEMARK OFFICE
CERTIFICATE OF CORRECTION

PATENT NO. : 7,560,133 B2
APPLICATION NO. : 10/296181
DATED : July 14, 2009
INVENTOR(S) : Takeo Kawase Page 1 of 1

It is certified that error appears in the above-identified patent and that said Letters Patent is hereby corrected as shown below:

<u>On the Cover Page</u>

Item (30) Related to Foreign Application Priority Data:
Please add the following to the foreign application priority data:
Add: April 3, 2001 (GB) ------------------ 0108347.6

Signed and Sealed this

Thirteenth Day of October, 2009

David J. Kappos
*Director of the United States Patent and Trademark Office*